United States Patent
Kweon et al.

(10) Patent No.: US 8,943,685 B2
(45) Date of Patent: Feb. 3, 2015

(54) METHOD OF MANUFACTURING A CAPACITOR-EMBEDDED PRINTED CIRCUIT BOARD

(75) Inventors: Young Do Kweon, Seoul (KR); Sung Yi, Suwon-si (KR); Hong-Won Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1143 days.

(21) Appl. No.: 12/923,992

(22) Filed: Oct. 19, 2010

(65) Prior Publication Data

US 2011/0035938 A1 Feb. 17, 2011

Related U.S. Application Data

(62) Division of application No. 12/076,651, filed on Mar. 20, 2008, now abandoned.

(30) Foreign Application Priority Data

Aug. 17, 2007 (KR) .................. 10-2007-0082676

(51) Int. Cl.
 *H05K 3/02* (2006.01)
 *H05K 1/16* (2006.01)
 (Continued)

(52) U.S. Cl.
 CPC .............. *H05K 1/162* (2013.01); *H05K 3/062* (2013.01); *H05K 3/4626* (2013.01); *H05K 3/4652* (2013.01); *H05K 3/4655* (2013.01); *H05K 2201/0195* (2013.01);
 (Continued)

(58) Field of Classification Search
 CPC ......... H05K 1/16; H05K 1/162; H05K 3/062; H05K 3/4626; H05K 3/4652; H05K 2201/09881; H05K 2201/0195; H05K 2201/09509; H05K 2201/0967; H05K 3/4655
 USPC .................. 29/846, 847, 852; 174/256, 258; 216/20; 427/96.1
 See application file for complete search history.

(56) References Cited

U.S. PATENT DOCUMENTS 5,362,926 A * 11/1994 Fukuda et al. ............... 174/256
5,698,470 A * 12/1997 Yamaguchi ..................... 216/20
(Continued)

FOREIGN PATENT DOCUMENTS

| JP | 10-135077 | 5/1998 |
|---|---|---|
| JP | 2005-39234 | 2/2005 |

(Continued)

OTHER PUBLICATIONS

Japanese Office Action issued Aug. 7, 2012 in corresponding Japanese Patent Application No. 2010-228739.
(Continued)

*Primary Examiner* — Donghai D Nguyen

(57) ABSTRACT

A method of manufacturing a capacitor-embedded printed circuit board using a first conductive layer formed on one side of an insulation layer, the method including: forming a second conductive layer on one side of the first conductive layer; forming a second electrode by removing a portion of the second conductive layer; forming a first electrode by removing a portion of the first conductive layer in correspondence with the second electrode; and forming a dielectric layer on one side of the second electrode.

6 Claims, 22 Drawing Sheets

(51) Int. Cl.
*H05K 3/06* (2006.01)
*H05K 3/46* (2006.01)

(52) U.S. Cl.
CPC .............. *H05K 2201/09509* (2013.01); *H05K 2201/09672* (2013.01); *H05K 2201/09881* (2013.01)
USPC .................. 29/847; 29/846; 174/256; 216/20

(56) References Cited

U.S. PATENT DOCUMENTS

| | | | |
|---|---|---|---|
| 5,745,334 | A | 4/1998 | Hoffarth et al. |
| 7,193,838 | B2 | 3/2007 | Dunn et al. |
| 7,523,548 | B2 * | 4/2009 | Kataoka et al. ............. 29/846 |
| 2002/0122283 | A1 | 9/2002 | Higashi et al. |
| 2007/0085166 | A1 | 4/2007 | Moon et al. |
| 2008/0118731 | A1 | 5/2008 | Srinivasan et al. |

FOREIGN PATENT DOCUMENTS

| | | |
|---|---|---|
| JP | 2006-156934 | 6/2006 |
| KR | 2002-0070892 | 7/2002 |
| KR | 10-2007-0053303 | 5/2007 |

OTHER PUBLICATIONS

U.S. Patent Office Action mailed Feb. 22, 2011 in corresponding U.S. Appl. No. 12/076,651.

U.S. Appl. No. 12/076,651, filed Mar. 20, 2008, Young-Do Kweon et al., Samsung Electro-Mechanics Co., Ltd.

Korean Patent Office Action, mailed Sep. 8, 2008 and issued in corresponding Korean Patent Application No. 10-2007-0082676.

Chinese Office Action issued on Nov. 27, 2009 in corresponding Chinese Patent Application No. 200810089173.X.

Chinese Office Action issued on May 11, 2010 in corresponding Chinese Patent Application No. 200810089173.X.

Japanese Office Action issued Jul. 13, 2010 in corresponding Japanese Patent Application No. 2008-136504.

U.S. Patent Office Action, mailed Aug. 18, 2010, issued in corresponding U.S. Appl. No. 12/076,651.

U.S. Patent Office Action, mailed Oct. 1, 2010, issued in corresponding U.S. Appl. No. 12/076,651.

* cited by examiner

METHOD OF MANUFACTURING A CAPACITOR-EMBEDDED PRINTED CIRCUIT BOARD

CROSS-REFERENCE TO RELATED APPLICATIONS

This application is a U.S. divisional application filed under 37 USC 1.53(b) claiming priority benefit of U.S. Ser. No. 12/076,651 filed in the United States on Mar. 20, 2008, now abandoned which claims earlier priority benefit to Korean Patent Application No. 10-2007-0082676 filed with the Korean Intellectual Property Office on Aug. 17, 2007, the disclosures of which are incorporated herein by reference.

BACKGROUND

1. Field

The present invention relates to a printed circuit board having embedded capacitors and to a method of manufacturing the printed circuit board.

2. Description of the Related Art

While most printed circuit boards had discrete chip resistors or discrete chip capacitors mounted on the surface in the past, printed circuit boards having embedded passive components such as resistors and capacitors, etc., have recently been developed.

The technology for the printed circuit board having embedded passive components employs new materials and new processes to insert the passive components, such as resistors or capacitors, etc., into the exterior or interior of the board, so that these may replace the conventional chip resistors and chip capacitors.

That is, the printed circuit board having embedded passive components may have passive components, e.g. capacitors, buried in the outside or inner layers of the board itself. Regardless of the size of the board, if a capacitor, i.e. a passive component, is integrated as a part of the printed circuit board, it is referred to as an embedded capacitor, and the board is referred to as a capacitor-embedded PCB.

According to the related art, a capacitor-embedded printed circuit board may be manufactured by a set of processes including: partially etching the copper layer of a copper clad laminate (CCL) to form lower electrodes, stacking a dielectric layer and an upper conductive layer over the lower electrodes, and then etching the upper conductive layer to form upper electrodes.

Here, deviations may occur due to the etching, during the forming of the lower electrode, which may cause errors in the area of contact between the dielectric layer and the lower electrodes. As a result, errors may occur also in the capacitance value of the capacitor, creating problems in the reliability of the capacitor.

As such, there is a need for a capacitor-embedded printed circuit board and a manufacturing method thereof, with which the deviations in the contact area of the lower electrodes, caused by the etching during the process for forming the lower electrode, can be reduced.

SUMMARY

An aspect of the invention is to provide a capacitor-embedded printed circuit board and a method of manufacturing the printed circuit board, in which deviations can be minimized in the area of contact between the electrode and the dielectric layer, so that errors in capacitance can be reduced.

One aspect of the invention provides a capacitor-embedded printed circuit board that includes: an insulation layer, a first electrode formed on one side of the insulation layer, a second electrode formed on one side of the first electrode, a dielectric layer formed on one side of the second electrode, and a third electrode formed on one side of the dielectric layer.

The first electrode and the second electrode can be made from materials reacting to different etchants. For example, the first electrode can contain copper (Cu), while the second electrode can contain at least one of nickel (Ni) and tin (Sn).

A thickness of the second electrode may be lower than or equal to a thickness of the first electrode.

Another aspect of the invention provides a method of manufacturing a capacitor-embedded printed circuit board using a first conductive layer formed on one side of an insulation layer. The method may include: forming a second conductive layer on one side of the first conductive layer, forming a second electrode by removing a portion of the second conductive layer, forming a first electrode by removing a portion of the first conductive layer in correspondence with the second electrode, and forming a dielectric layer on one side of the second electrode.

The operation of forming the second conductive layer can be performed by at least one method selected from a group consisting of electroplating, electroless plating, vacuum deposition, sputtering, and chemical vapor deposition (CVD).

The first electrode and the second electrode may be made from materials reacting to different etchants, in which case forming the second electrode may include removing a portion of the second conductive layer by applying a second etchant to a portion of the second conductive layer, and forming the first electrode may include removing a portion of the first conductive layer by applying a first etchant to a portion of the first conductive layer.

The first electrode can contain copper (Cu), while the second electrode can contain at least one of nickel (Ni) and tin (Sn).

Before forming the dielectric layer, an operation may be included of filling an insulating material in positions where the portion of the first conductive layer and the portion of the second conductive layer are removed.

After forming the dielectric layer, the method may further include forming a third conductive layer on one side of the dielectric layer, and forming a third electrode by removing a portion of the third conductive layer in correspondence with the second electrode.

The dielectric layer can have a third conductive layer formed on one side thereof. In such cases, the method may further include, after forming the dielectric layer, forming a third electrode by removing a portion of the third conductive layer in correspondence with the second electrode.

As will be seen below, in certain embodiments of the invention, the electrodes of the capacitor may be formed in a dual structure that has a second electrode formed on one side of a first electrode, whereby deviations in contact area may be minimized between the second electrode and the dielectric layer, so that errors in capacitance may be reduced.

Additional aspects and advantages of the present invention will be set forth in part in the description which follows, and in part will be obvious from the description, or may be learned by practice of the invention.

BRIEF DESCRIPTION OF THE DRAWINGS

FIG. 5A, FIG. 5B, FIG. 5C, FIG. 5D, FIG. 5E, FIG. 5F, FIG. 5G, FIG. 5H, and FIG. 5I are cross-sectional views representing a flow diagram for the first disclosed embodiment of a method of manufacturing a capacitor-embedded printed circuit board based on another aspect of the present invention.

DESCRIPTION OF EMBODIMENTS

Figure 1:
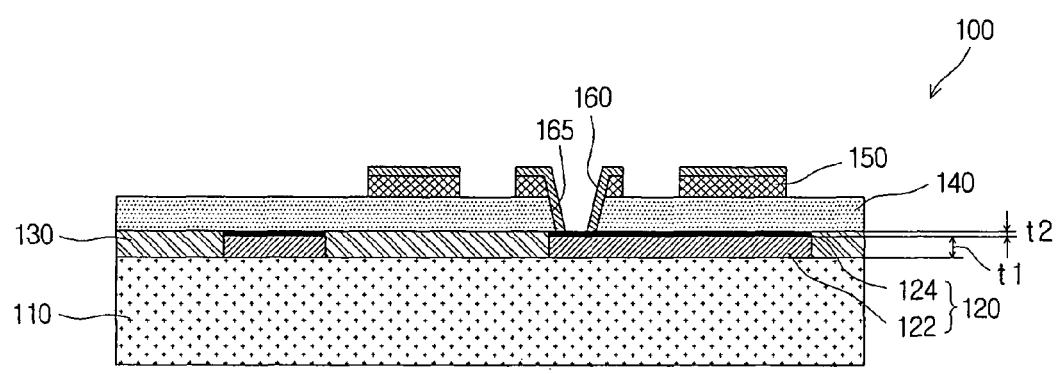
FIG. 1 is a cross-sectional view illustrating an embodiment of a capacitor-embedded printed circuit board based on one aspect of the present invention.

The capacitor-embedded printed circuit board and manufacturing method thereof based on certain embodiments of the invention will be described below in more detail with reference to the accompanying drawings. Those elements that are the same or are in correspondence are rendered the same reference numeral regardless of the figure number, and redundant explanations are omitted.

Figure 2:
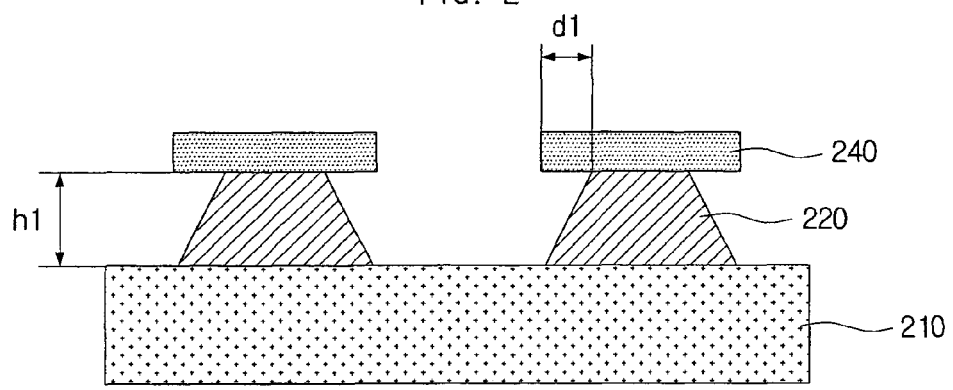
FIG. 2 and FIG. 3 are cross-sectional views illustrating etching deviations according to the thickness of the electrodes in a capacitor.
Figure 3:
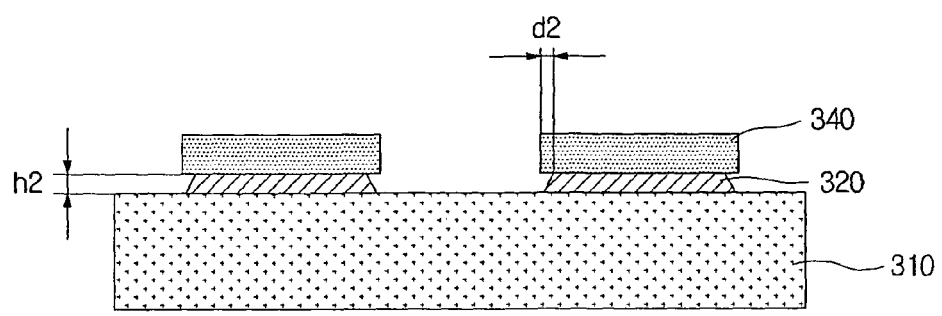

FIG. 1 is a cross-sectional view illustrating an embodiment of a capacitor-embedded printed circuit board based on one aspect of the present invention, and FIG. 2 and FIG. 3 are cross-sectional views illustrating etching deviations according to the thickness of the electrodes in a capacitor.

The terms "upper electrode" and "lower electrode" describe relative concepts, and thus may be substituted one for the other. For convenience, however, the descriptions that follow will use "upper electrode" to refer to the electrode positioned over the dielectric layer, and "lower electrode" to refer to the electrode under the dielectric layer, as illustrated in FIG. 1.

That is, the dual structure including the first electrode and the second electrode will correspond to the lower electrode, and the third electrode will correspond to the upper electrode, while the dual structure including the first conductive layer and the second conductive layer will correspond to the lower conductive layer, and the third conductive layer will correspond to the upper conductive layer.

Also, terms such as "first" and "second," etc., are used merely to distinguish between identical or corresponding elements. As such, identical or corresponding elements are not to be limited to particular elements by such terms as "first" and "second," etc.

In FIGS. 1 to 3, there are illustrated insulation layers 110, 210, 310, first electrodes 122, second electrodes 124, lower electrodes 120, 220, 320, an insulating material 130, dielectric layers 140, 240, 340, an upper electrode 150, a via 160, and a via hole 165.

This embodiment provides a capacitor-embedded printed circuit board 100, in which the lower electrode 120 of a capacitor may be formed as a dual structure, with a second electrode 124 formed over a first electrode 122, so that deviations in contact area can be minimized between the second electrode 124 and the dielectric layer 140.

The capacitor can be composed mainly of an upper electrode 150 and a lower electrode 120 that face each other, and a dielectric layer 140 positioned in-between. When power is supplied to the opposing upper electrode 150 and lower electrode 120, an amount of charge can be stored proportionally.

The insulation layer 110 can be a part of a copper clad laminate (CCL), and can be made of an insulating resin, etc., that does not allow the flow of electricity. Thus, a circuit pattern may be formed on the side of the insulation layer 110 on which the first electrode 122 is formed, without having short circuiting between circuit patterns.

The lower electrode 120 may be composed of a first electrode 122, formed on one side of the insulation layer 110, and a second electrode 124, formed on one side of the first electrode and positioned in contact with the dielectric layer 140. The first electrode 122 and second electrode 124 can be formed by removing portions of a first conductive layer 522 (FIG. 5), which can be the copper layer of a copper clad laminate, and a second conductive layer 524 (FIG. 5) formed on the first conductive layer 522.

While this embodiment presents an example in which the first electrode 122 is a part of a copper clad laminate, it is to be appreciated that the first electrode 122 can be a part of a pre-designed pattern formed on a double-sided printed circuit board or a multilayered printed circuit board, etc.

The second conductive layer 524 (FIG. 5) can be formed on the one side of the first conductive layer 522 (FIG. 5) by at least one of electroplating, electroless plating, vacuum deposition, sputtering, and chemical vapor deposition (CVD).

The first electrode 122 and the second electrode 124 can be formed by etching the first conductive layer 522 (FIG. 5) and the second conductive layer 524 (FIG. 5). First, the second electrode 124 touching the dielectric layer 140 can be formed by a photolithography method, which may include coating an etching resist over the second conductive layer 524 (FIG. 5), applying exposure and development processes, and then applying a second etchant to remove portions of the second conductive layer 524 (FIG. 5).

Here, the second conductive layer 524 (FIG. 5), which is in contact with the dielectric layer 140, and the first conductive layer 522 (FIG. 5) can be made from materials that react to different etchants. Likewise, the second electrode 124, which is in contact with and the dielectric layer 140, and the first electrode 122 can be made from materials that react to different etchants. For example, the second conductive layer 524 (FIG. 5) and the second electrode 124 can be made of nickel (Ni) or tin (Sn), while the first conductive layer 522 (FIG. 5) can be made from the copper layer of the copper clad laminate. Then, by using an etchant that reacts only with nickel or tin, the second electrode 124 may be formed without affecting the first conductive layer 522 (FIG. 5).

Next, the first electrode 122, i.e. the portion of the copper clad laminate, can be formed in correspondence to the second electrode 124 touching the dielectric layer 140, by etching portions of the first conductive layer 522 (FIG. 5) in a manner similar to that for the forming of the second electrode 124.

Here, the second electrode 124 can be used as an etching resist for the first electrode 122. Thus, the first electrode 122 may be formed by applying a first etchant to portions of the first conductive layer 522 (FIG. 5), without having to employ a separate resist. That is, the first conductive layer 522 (FIG. 5) and the first electrode 122 can be made of copper (Cu), and the first electrode 122 can be formed using for the first etchant an etchant that reacts only with copper.

As such, portions of the second conductive layer 524 (FIG. 5) may be removed using a corresponding second etchant, after which the remaining second electrode 124 may be used as a resist for the first conductive layer 522 (FIG. 5). Then, using a first etchant that reacts with the first conductive layer 522 (FIG. 5), portions of the first conductive layer 522 (FIG. 5) may be removed in correspondence to the second electrode 124, to form the first electrode 122. In this way, the manufacturing process for the capacitor-embedded printed circuit board 100 may be simplified.

When removing portions of a metal layer by etching, to form a pre-designed pattern, the properties of the etching process itself cause the upper portions of the pattern, which are not supported by the substrate, etc., to become narrower, and create deviations in area in these upper portions. These will be referred to herein as etching deviations. With reference to FIGS. 2 and 3, a discussion will be provided below on the differences in etching deviation according to the thickness of the lower electrode 120.

Referring to FIG. 2 and FIG. 3, when forming lower electrodes 220, 320 by removing portions of the metal layer by etching, in order to form capacitors on a copper clad laminate having a metal layer formed on an insulation layer 210, 310, the upper portions of the lower electrodes 220, 320 that are in contact with the dielectric layer 240, 340 may be formed narrower compared to the lower portions of the lower electrodes 220, 320 that are in contact with the insulation layer 210, 310 of the copper clad laminate. As a result, etching deviations d1, d2 occur in the area of contact with the dielectric layer 240, 340, creating errors in the capacitance of the capacitor.

As the thickness h2 of the lower electrodes illustrated in FIG. 3 is lower than the thickness h1 of the lower electrodes illustrated in FIG. 2, the etching deviations d2 in FIG. 3 may be smaller than the etching deviations d1 illustrated in FIG. 2. Consequently, the errors in capacitance can be made smaller when the thickness h2 of the lower electrodes is made lower.

Therefore, if the lower electrode 120 of the capacitor is formed as a dual structure, as in this particular embodiment, the etching deviations occur only for the area of the second electrode 124 touching the dielectric layer 140, so that the errors in capacitance can be reduced when considering the overall thickness of the entire electrode.

The thickness t2 of the second electrode can be made lower than or equal to the thickness t1 of the first electrode, allowing the etching deviations for the second electrode 124 to be miniscule compared to the sum total of the thickness t1 of the first electrode and the thickness t2 of the second electrode. In this way, the reliability of the capacitor can be increased.

An insulating material 130 can be filled in to replace the portions of the first conductive layer 522 (FIG. 5) and the second conductive layer 524 (FIG. 5) removed by etching. That is, the spaces other than the first electrode 122 and the second electrode 124 can be filled with insulating material 130. Leveling the upper surface, e.g. by surface polishing, for forming the dielectric layer 140 and upper electrode 150, can enhance the performance of the capacitor after the dielectric layer 140 and the upper electrode 150 are formed.

The dielectric layer 140 may be stacked on one side of the second electrode 124, and the upper electrode 150 may be stacked on one side of the dielectric layer 140. The properties of the dielectric layer 140 contribute to determining the capacitance of the capacitor, as the capacitance is proportional to the dielectric constant of the dielectric layer 140. The dielectric layer 140 can be made of glass, ceramic, tantalum pentoxide, a polystyrene type plastic, or polycarbonate, etc., or can even be a layer of air. The upper electrode 150 can be made of a metal material, such as copper, etc.

The arrangement of the dielectric layer 140 and upper electrode 150 can be obtained by stacking the dielectric layer 140 over one side of the second electrode 124, stacking an upper conductive layer 550 (FIG. 5) over one side of the dielectric layer 140, and then removing portions of the upper conductive layer 550 (FIG. 5).

First, the dielectric layer 140 may be stacked over one side of the second electrode 124, after which the upper conductive layer 550 (FIG. 5) may be stacked in order on one side of the dielectric layer 140, and the upper electrode 150 may be formed in correspondence with the lower electrode 120 by removing portions of the upper conductive layer 550 (FIG. 5) by photolithography. This may result in the upper electrode 150 and lower electrode 120, as well as the interposed dielectric layer 140, as required in a typical capacitor.

The dielectric layer 140 may have an upper conductive layer 750 (FIG. 7) formed on one side beforehand, so that the stacking of the upper conductive layer 750 (FIG. 7) may be omitted. That is, an RCC (resin-coated copper) layer, for example, may be stacked on one side of the second electrode 124 with the dielectric layer 140 portion facing the second electrode 124, after which portions of the upper conductive layer 750 (FIG. 7) may be removed to form the upper electrode 150. In this arrangement, since it is not necessary to stack a separate upper conductive layer 750 (FIG. 7) onto one side of the dielectric layer 140, the manufacturing process for the capacitor-embedded printed circuit board 100 may further be simplified.

The RCC layer may be formed by coating an insulating material directly onto an upper conductive layer 750 (FIG. 7) made of a metal material, such as copper, etc., to provide the dielectric layer 140. Use of the RCC layer allows minimum thicknesses for the dielectric layer 140 and the upper conductive layer 750 (FIG. 7), so that the embedded capacitor can be constructed with a low thickness.

By using an RCC layer for the dielectric layer 140 and the upper conductive layer 750 (FIG. 7), the dielectric layer 140 and upper conductive layer 750 (FIG. 7) can be stacked as an integrated body. This can simplify the process for manufacturing the capacitor-embedded printed circuit board 100, while at the same time providing a thinner and lighter capacitor-embedded printed circuit board 100.

Vias 160 can be formed in the dielectric layer 140 and upper conductive layer 550 (FIG. 5), in order to electrically connect the electrodes of the capacitor with the exterior. That is, a via hole 165 may be perforated in the upper conductive layer 550 (FIG. 5) and the dielectric layer 140, for example, by means of a drill, etc., and the inside of the via hole 165 may be filled with a conductive material, to form a via 160 that connects with the second electrode 124 touching the dielectric layer 140.

First, the via hole 165 may be perforated in the upper conductive layer 550 (FIG. 5) and the dielectric layer 140, in correspondence with the position of the second electrode 124. The via 165 may be perforated through the upper conductive layer 550 (FIG. 5) and dielectric layer 140 by drilling, for example. Of course, post-processing procedures such as deburring and desmearing may also be performed as necessary. Afterwards, a conductive material can be filled inside the via hole 165. By forming a conductive material on the inside the via hole 165, using a process such as copper plating, panel plating, and pattern plating, etc., the lower electrode 120 of the capacitor may be electrically connected with the exterior.

In this embodiment, the lower electrode 120 of the capacitor may be formed as a dual structure made of materials that react to different etchants, and the thickness t2 of the second electrode, which is placed in contact with the dielectric layer 140, may be made lower than that of the first electrode 122. Thus, the etching deviations of the lower electrode 120 can be minimized, and consequently, errors in the capacitance of the capacitor may be reduced, thereby increasing the reliability of the capacitor.

The following provides a description on a first disclosed embodiment of a manufacturing method for a capacitor-embedded printed circuit board based on another aspect of the present invention.

Figure 4:
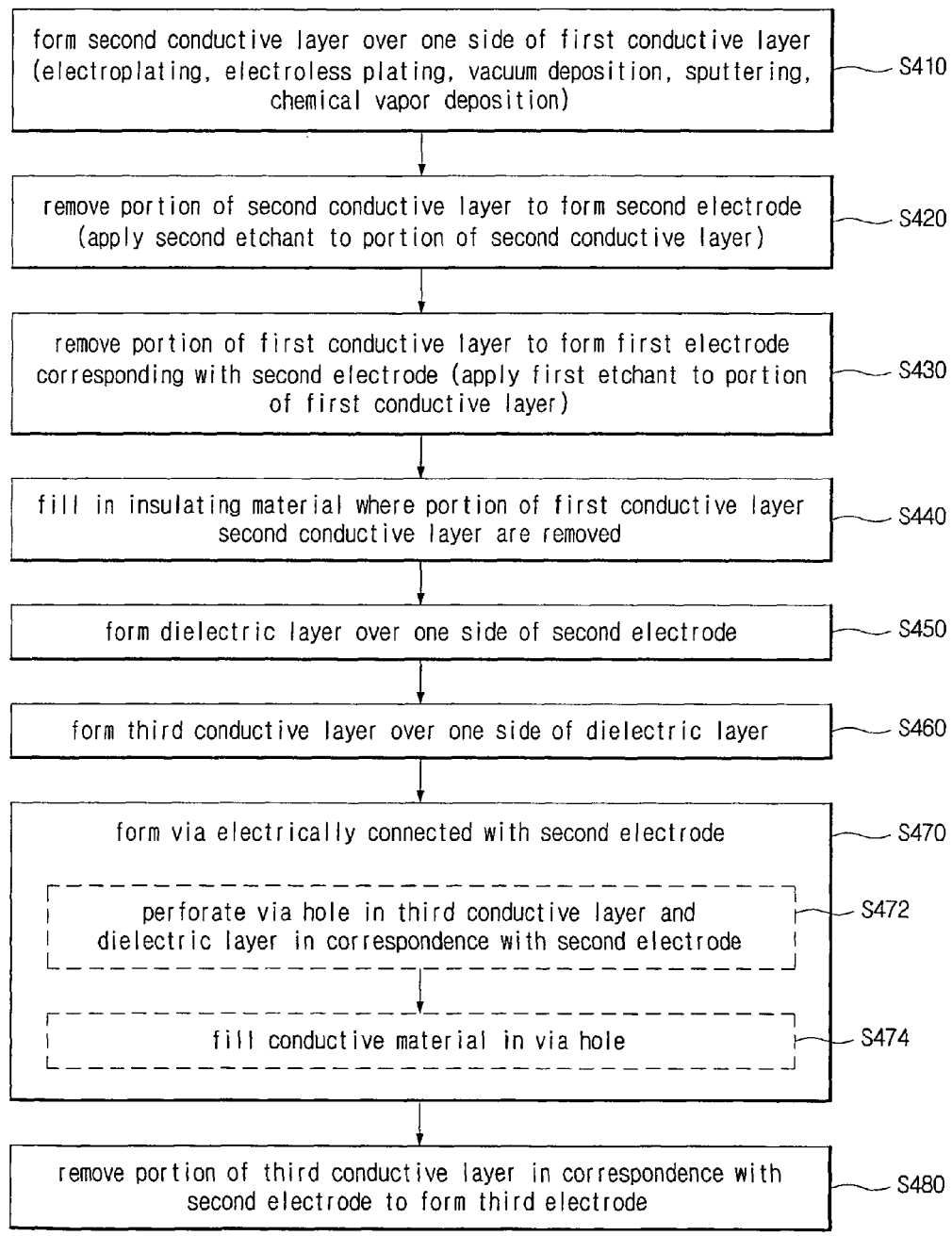
FIG. 4 is a flowchart illustrating a first disclosed embodiment of a method of manufacturing a capacitor-embedded printed circuit board based on another aspect of the present invention.

FIG. 4 is a flowchart illustrating a first disclosed embodiment of a method of manufacturing a capacitor-embedded printed circuit board based on another aspect of the present invention, and FIG. 5A through FIG. 5I are cross-sectional views representing a flow diagram for the first disclosed embodiment of a method of manufacturing a capacitor-embedded printed circuit board based on another aspect of the present invention. In FIG. 4 and FIGS. 5A to 5I, there are illustrated an insulation layer 510, a first conductive layer 522, a second conductive layer 524, a lower conductive layer 520, a first electrode 522', a second electrode 524', a lower electrode 520', an insulating material 530, a dielectric layer 540, an upper conductive layer 550, an upper electrode 550', a via 560, and a via hole 565.

In this first disclosed embodiment, the lower conductive layer 520 of the capacitor may be composed as a dual structure, in which a second conductive layer 524 may be formed on one side of a first conductive layer 522, after which a lower electrode 520' may be formed by a sequential etching process. As such, a manufacturing method for a capacitor-embedded printed circuit board 500 is presented, with which deviations in the area of contact between the lower electrode 520' and the dielectric layer 540 may be minimized.

Figure 5A:
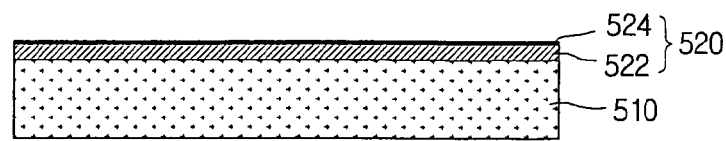

First, as shown in FIG. 5A, a second conductive layer may be formed on one side of a first conductive layer (S410). That is, the second conductive layer 524, which is to be placed in contact with a dielectric layer 540, may be formed on one side of the first conductive layer 522, which can be a copper layer formed on one side of an insulation layer 510 as a part of a copper clad laminate. The second conductive layer 524 may be formed on the one side of the first conductive layer 522 by at least one of electroplating, electroless plating, vacuum deposition, sputtering, and chemical vapor deposition (CVD).

While the example presented in this embodiment describes the first conductive layer 522 as a part of a copper clad laminate, it is to be appreciated that the first conductive layer 522 can be a metal layer that is a part of a double-sided printed circuit board or a multilayered printed circuit board, etc.

By thus forming a lower conductive layer 520 made of a dual structure, the etching deviations for the lower electrode 520' can be reduced. This will be described later in more detail with reference to the second electrode 524' positioned in contact with the first electrode 522' and the dielectric layer 540.

Figure 5B:
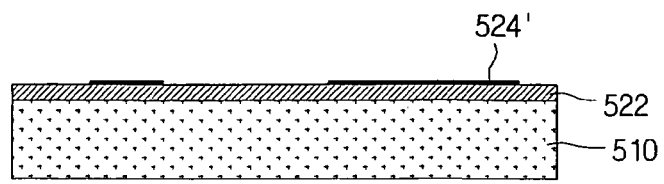

Next, as shown in FIG. 5B, portions of the second conductive layer may be removed to form a second electrode (S420). The second electrode 524', which is to be positioned in contact against the dielectric layer 540, can be formed by a photolithography method, by coating the second conductive layer 524 with an etching resist, performing exposure and development processes, and then applying a second etchant to portions of the second conductive layer 524 to remove the portions of the second conductive layer 524.

Here, the first conductive layer 522 and the second conductive layer 524, which is to be in contact against the dielectric layer 540, may be made from materials that react to different etchants. For example, the second conductive layer 524 can be made of nickel or tin, in which case, a second etchant that reacts only with nickel or tin may be used to form the second electrode 524', without affecting the first conductive layer 522 (FIG. 5), which can be made from the copper layer of a copper clad laminate.

Figure 5C:
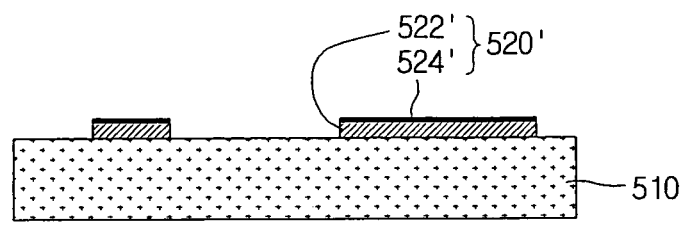

Next, as shown in FIG. 5C, portions of the first conductive layer may be removed to form a first electrode in correspondence with the second electrode (S430). That is, similar to the forming of the second electrode 524', which touches the dielectric layer 540, the first electrode 522' may also be formed by removing portions of the first conductive layer 522 using etching.

Here, the second electrode 524' can be used as an etching resist, so that the first electrode 522' may be formed by applying a first etchant to the portions of the first conductive layer 522, without having to use a separate resist. For example, the first conductive layer 522 can be made of copper, in which case the first electrode 522' may be formed using a first etchant that reacts only with copper.

After removing portions of the second conductive layer 524 using a corresponding second etchant, the remaining second electrode 524' can be used as a resist for the first conductive layer 522. As this eliminates the need for a separate mask and resist, the manufacturing process for the capacitor-embedded printed circuit board 500 can be simplified.

When removing portions of a metal layer by etching, to form a pre-designed pattern, the properties of the etching process cause the upper portions of the pattern, which are not supported by the substrate, etc., to become narrower, and create etching deviations. However, if the lower conductive layer 520 is formed as a dual structure as in this embodiment, the deviations may occur only for the area of the second electrode 524' touching the dielectric layer 540, so that the errors in capacitance can be reduced compared to the overall thickness of the entire lower electrode 520'.

Figure 5D:
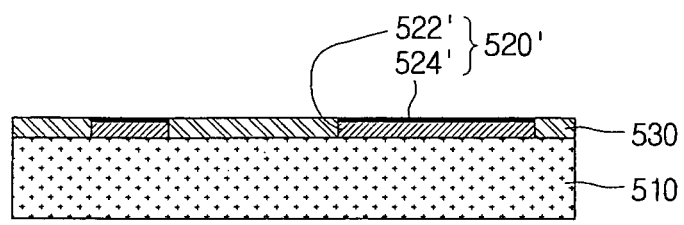

Next, as shown in FIG. 5D, an insulating material may be filled in where the portions of the first conductive layer and second conductive layer have been removed (S440). That is, the portions where the first conductive layer 522 and the second conductive layer 524 touching the dielectric layer 540 have been removed may be filled with the insulating material 530, and the upper surface may be leveled, e.g. by surface polishing, to enhance the performance of the capacitor after the dielectric layer 140 and the upper electrode 150 are formed.

Figure 5E:
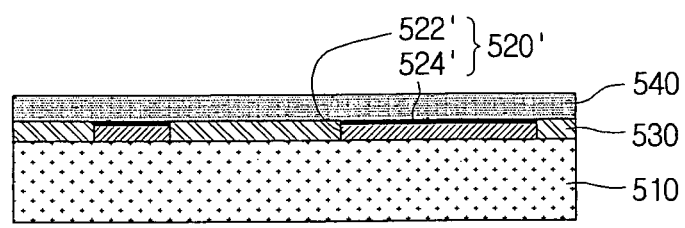

Next, as shown in FIG. 5E, a dielectric layer may be formed on one side of the second electrode (S450). That is, the dielectric layer 540 may be stacked, which will be interposed between an upper electrode 550' and the lower electrode 520', so that a capacitor may be formed.

Figure 5F:
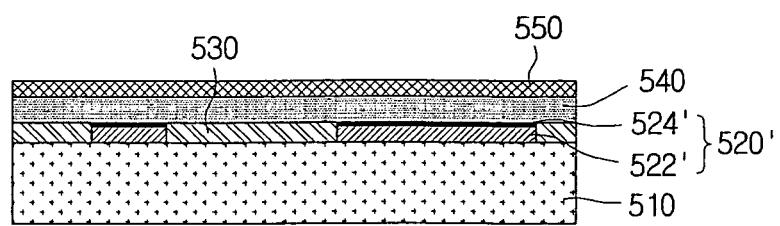

Next, as shown in FIG. 5F, a third conductive layer may be stacked on one side of the dielectric layer (S460). Stacking the dielectric layer 540 and the upper conductive layer 550 over one side of the second electrode 524', and removing portions of the upper conductive layer 550 to form the upper electrode 550' allow the capacitor to function.

Next, a via may be formed that electrically connect with the second electrode (S470). One process for forming the via 560 can be as follows.

Figure 5G:
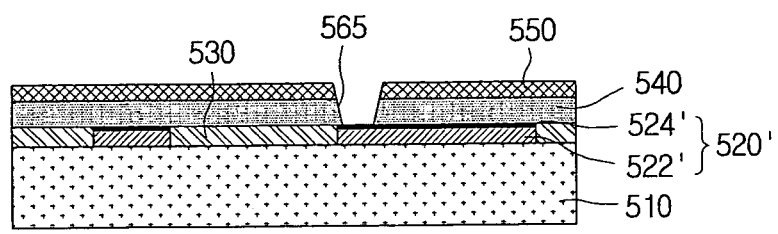

First, as shown in FIG. 5G, a via hole may be perforated in the third conductive layer and the dielectric layer, in correspondence to the second electrode (S472). The via hole 565 may be formed in the upper conductive layer 550 and dielectric layer 540 by drilling, for example. Of course, post-processing procedures such as deburring and desmearing may also be performed as necessary.

Figure 5H:
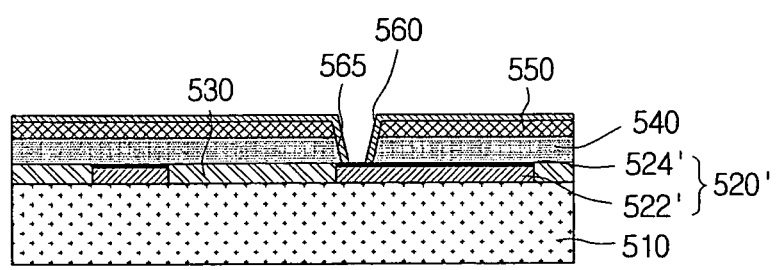
Figure 51:
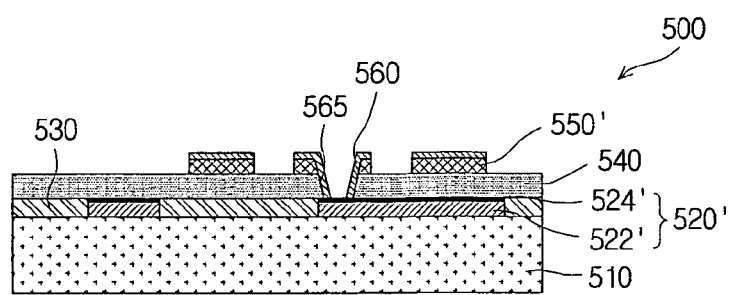

Afterwards, as shown in FIG. 5H, a conductive material can be filled inside the via hole 565 (S474). By forming a conductive material inside the via hole 565, using a process such as copper plating, panel plating, and pattern plating, etc., the lower electrode 520' of the capacitor may be electrically connected with the exterior.

Lastly, as shown in FIG. 5I, portions of the third conductive layer may be removed to form a third electrode in correspondence with the second electrode (S480). By removing portions of the upper conductive layer 550, for example, using etching by photolithography, the upper electrode 550' of the capacitor may be formed in correspondence with the lower electrode 520'.

In this way, the upper electrode 550', lower electrode 520', and dielectric layer 540 interposed in-between, as required in a capacitor may be obtained. When power is supplied to the opposing upper electrode 550' and lower electrode 520', an amount of electrical charge can be stored proportionally.

In this embodiment, the lower conductive layer 520 of the capacitor may be formed as a dual structure made of materials that react to different etchants, whereby the etching deviations of the lower electrode 520' can be minimized, and consequently, errors in the capacitance of the capacitor may be reduced, to thus increase the reliability of the capacitor.

The following provides a description on a second disclosed embodiment of a manufacturing method for a capacitor-embedded printed circuit board based on another aspect of the present invention.

Figure 6:
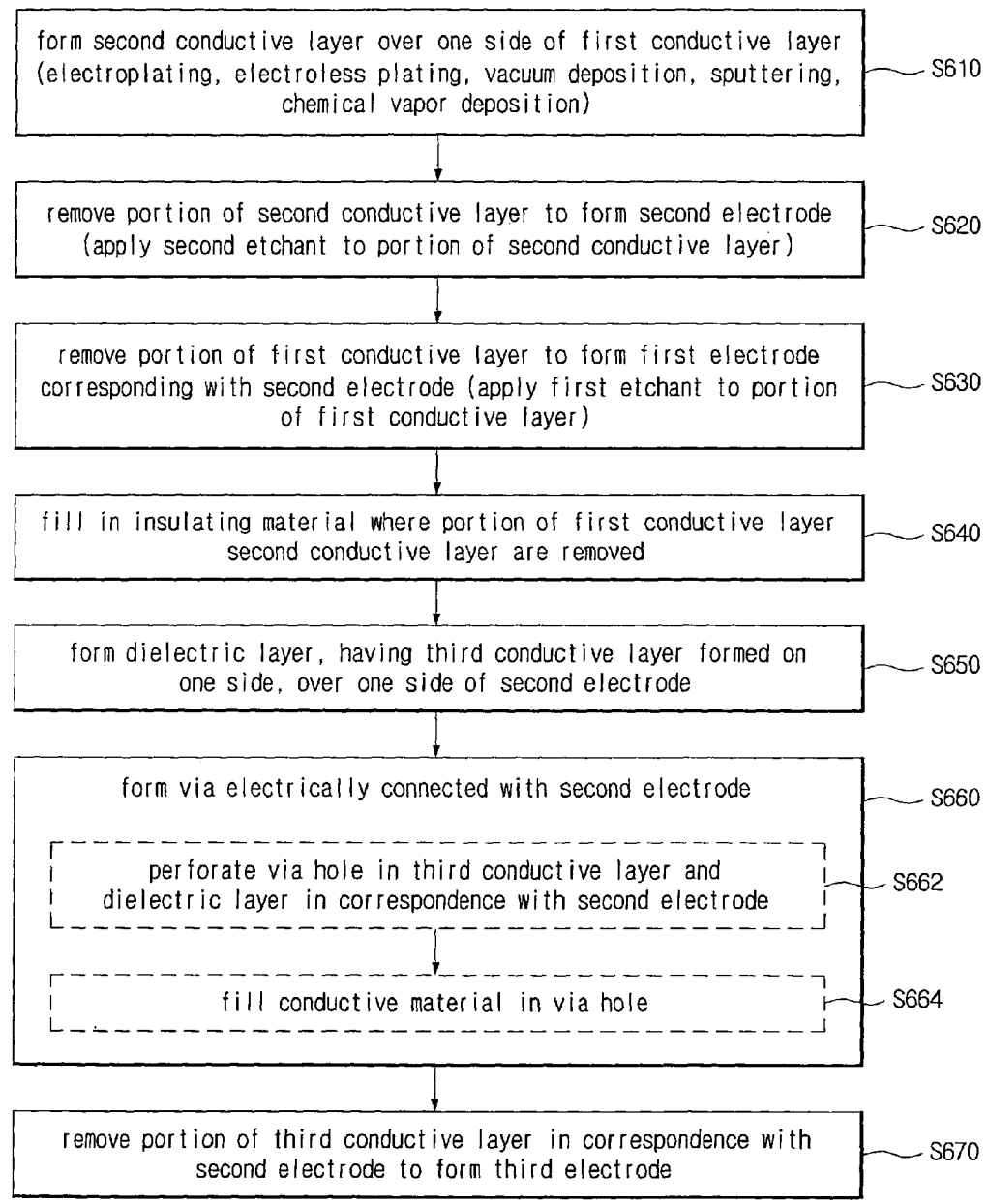
FIG. 6 is a flowchart illustrating a second disclosed embodiment of a method of manufacturing a capacitor-embedded printed circuit board based on another aspect of the present invention.

FIG. 6 is a flowchart illustrating a second disclosed embodiment of a method of manufacturing a capacitor-embedded printed circuit board based on another aspect of the present invention, and FIG. 7A through FIG. 7H are cross-sectional views representing a flow diagram for the second disclosed embodiment of a method of manufacturing a capacitor-embedded printed circuit board based on another aspect of the present invention. In FIG. 6 and FIGS. 7A to 7H, there are illustrated an insulation layer 710, a first conductive layer 722, a second conductive layer 724, a lower conductive layer 720, a first electrode 722', a second electrode 724', a lower electrode 720', an insulating material 730, a dielectric layer 740, an upper conductive layer 750, an RCC layer 755, an upper electrode 750', a via 760, and a via hole 765.

In this second disclosed embodiment, the lower conductive layer 720 of the capacitor may be composed as a dual structure, in which a second conductive layer 724 may be formed on one side of a first conductive layer 722, after which a lower electrode 720' may be formed by a sequential etching process. As such, a manufacturing method for a capacitor-embedded printed circuit board 700 is presented, with which deviations in the area of contact between the lower electrode 720' and the dielectric layer 740 may be minimized, and with which the dielectric layer 740 and the upper conductive layer 750 may be formed in a simplified manner.

Figure 7A:
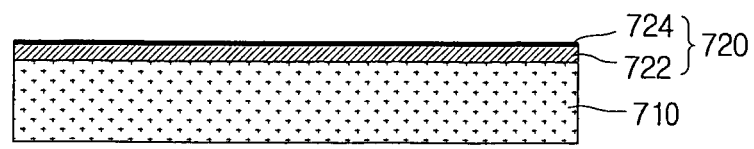
FIG. 7A, FIG. 7B, FIG. 7C, FIG. 7D, FIG. 7E, FIG. 7F, FIG. 7G, and FIG. 7H are cross-sectional views representing a flow diagram for the second disclosed embodiment of a method of manufacturing a capacitor-embedded printed circuit board based on another aspect of the present invention.
Figure 7B:
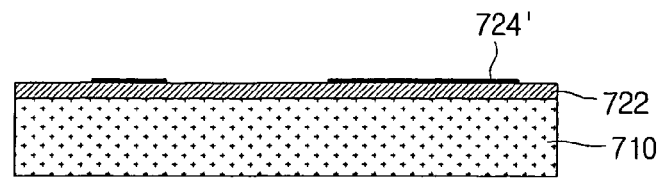
Figure 7C:
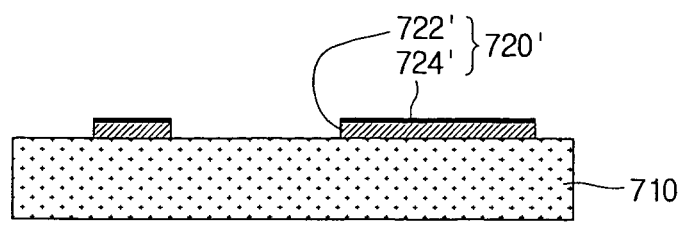

First, as shown in FIG. 7A, a second conductive layer may be formed on one side of a first conductive layer (S610). Afterwards, as shown in FIG. 7B, portions of the second conductive layer may be removed to form a second electrode (S620), and as shown in FIG. 7C, portions of the first conductive layer may be removed to form a first electrode in correspondence with the second electrode (S630).

Figure 7D:
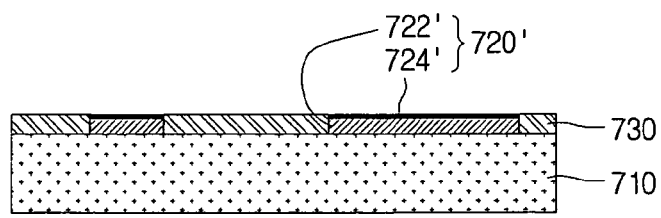
Figure 7E:
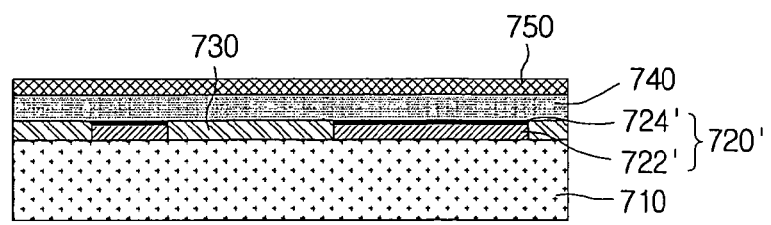

Next, as shown in FIG. 7D, an insulating material may be filled in where portions of the first conductive layer and the second conductive layer have been removed (S640), and as shown in FIG. 7E, a dielectric layer having a third conductive layer formed on one side may be formed over one side of the second electrode (S650).

Figure 7F:
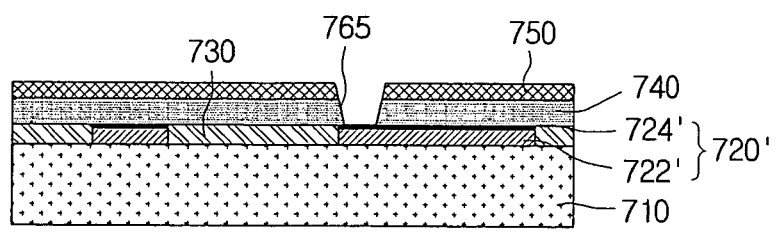
Figure 7G:
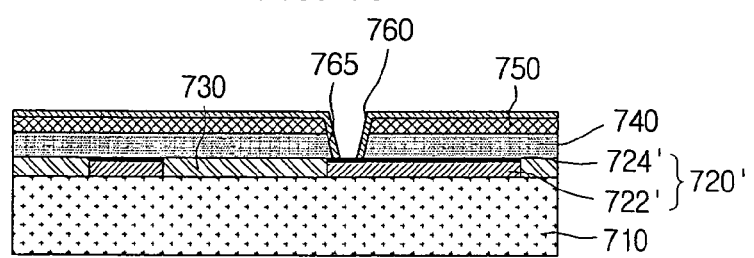

Next, a via electrically connected with the second electrode may be formed (S660), the operation of which can be divided into a process for perforating a via hole in the third conductive layer and the dielectric layer in correspondence to the second electrode, as shown in FIG. 7F (S662), and a process for filling the inside of the via hole with a conductive material (S664), as shown in FIG. 7G.

Figure 7H:
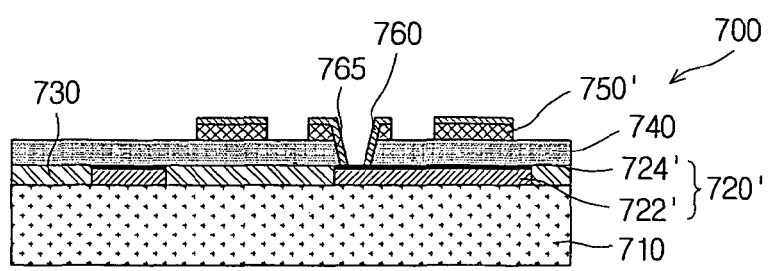

Lastly, as shown in FIG. 7H, portions of the third conductive layer may be removed to form a third electrode in correspondence with the second electrode (S670).

In this embodiment, illustrated in FIGS. 7A to 7H, the process for forming a second conductive layer 724 over a first conductive layer 722 formed on an insulation layer 710 to form a lower conductive layer 720, the process for sequentially etching the layers to form a lower electrode 720' that includes a first electrode 722' and a second electrode 724', the process for filling in an insulating material 730, the process for forming a via hole 765 and via 760, and the process for forming the upper electrode 750' are substantially the same as or are in corresponding relationships with the processes described for the first disclosed embodiment, and thus will not be presented in further detail. The following description will focus more on the differences from the first disclosed embodiment, one of which is the forming of the dielectric layer 740 that has an upper conductive layer 750 formed on one side.

After filling the insulating material 730 where the portions of the lower conductive layer 720 have been removed, a dielectric layer, which has a third conductive layer formed on one side, may be formed over one side of the second electrode (S650), as shown in FIG. 7E. That is, on one side of the second electrode 724', an RCC layer 755, for example, may be stacked. By stacking the RCC layer 755 on one side of the second electrode 724' such that the dielectric layer 740 portion of the RCC layer 755 faces the second electrode 724', the dielectric layer 740 and the upper conductive layer 750 may be formed as an integrated body.

In this embodiment, the dielectric layer 740 and the upper conductive layer 750 may be provided in an integrated form, to simplify the process for manufacturing the capacitor-embedded printed circuit board 700, while providing a capacitor-embedded printed circuit board 700 that is thinner and lighter.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a capacitor-embedded printed circuit board using a first conductive layer formed on one side of an insulation layer, the method comprising:
    forming a second conductive layer on one side of the first conductive layer;
    forming a second electrode by removing a portion of the second conductive layer;
    forming a first electrode by removing a portion of the first conductive layer in correspondence with the second electrode;
    forming a dielectric layer on one side of the second electrode; and
    forming a third electrode in correspondence with the second electrode, wherein
    the first electrode and the second electrode are made from materials that react to different etchants,
    the first electrode does not react with a second etchant that reacts with the second electrode,
    the second electrode does not react with a first etchant that reacts with the first electrode, the forming the second electrode comprises removing a portion of the second conductive layer by applying the second etchant to a portion of the second conductive layer, and the forming the first electrode comprises removing a portion of the first conductive layer by using the second electrode as an etching resist and applying the first etchant to a portion of the first conductive layer.

2. The method of claim 1, wherein forming the second conductive layer is performed by at least one method selected from a group consisting of electroplating, electroless plating, vacuum deposition, sputtering, and chemical vapor deposition (CVD).

3. The method of claim 1, further comprising, before forming the dielectric layer:

filling an insulating material in positions where the portion of the first conductive layer and the portion of the second conductive layer are removed.

4. The method of claim 1, wherein forming the third electrode comprises:

forming a third conductive layer on one side of the dielectric layer; and forming the third electrode by removing a portion of the third conductive layer in correspondence with the second electrode.

5. The method of claim 1, wherein the dielectric layer has a third conductive layer formed on one side thereof.

6. The method of claim 5, wherein forming the third electrode comprises:

forming the third electrode by removing a portion of the third conductive layer in correspondence with the second electrode.

* * * * *